United States Patent
Lee et al.

(10) Patent No.: US 9,598,310 B2
(45) Date of Patent: Mar. 21, 2017

(54) APPARATUS OF ETCHING GLASS SUBSTRATE

(75) Inventors: Ah-Ram Lee, Suwon-si (KR); Kwan-Young Han, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1328 days.

(21) Appl. No.: 13/244,118

(22) Filed: Sep. 23, 2011

(65) Prior Publication Data

US 2012/0103520 A1 May 3, 2012

(30) Foreign Application Priority Data

Oct. 28, 2010 (KR) ........................ 10-2010-0106208

(51) Int. Cl.

| | |
|---|---|
| B08B 3/10 | (2006.01) |
| B24B 37/013 | (2012.01) |
| B24B 49/12 | (2006.01) |
| C03C 15/00 | (2006.01) |
| C03C 15/02 | (2006.01) |
| G01B 11/02 | (2006.01) |
| H01L 21/67 | (2006.01) |
| G01B 11/06 | (2006.01) |

(52) U.S. Cl.
CPC .............. *C03C 15/02* (2013.01); *B08B 3/102* (2013.01); *B24B 37/013* (2013.01); *B24B 49/12* (2013.01); *C03C 15/00* (2013.01); *G01B 11/0683* (2013.01); *H01L 21/67057* (2013.01)

(58) Field of Classification Search
None
See application file for complete search history.

(56) References Cited

U.S. PATENT DOCUMENTS

| | | | | |
|---|---|---|---|---|
| 2,411,298 | A | * | 11/1946 | Shore ....................... H03H 3/04 216/90 |
| 3,374,130 | A | | 3/1968 | Junge et al. |
| 3,649,509 | A | * | 3/1972 | Morawetz ................ C25D 5/08 204/238 |
| 3,798,056 | A | * | 3/1974 | Okinaka ............... C23C 18/163 118/409 |
| 5,277,715 | A | * | 1/1994 | Cathey ............................ 134/2 |

(Continued)

FOREIGN PATENT DOCUMENTS

| | | | |
|---|---|---|---|
| CN | 1380572 A | 11/2002 | |
| DE | 4405278 C1 * | 5/1995 | ............. C03C 15/00 |

(Continued)

OTHER PUBLICATIONS

Office Actions dated Dec. 31, 2014, Jul. 7, 2014 & Jan. 21, 2014 (currently each also made record) from the corresponding Chinese application (CN 20111333585) of this US application.*

(Continued)

*Primary Examiner* — Paviz Hassanzadeh
*Assistant Examiner* — Stanislav Antolin
(74) *Attorney, Agent, or Firm* — Lewis Roca Rothgerber Christie LLP

(57) ABSTRACT

An apparatus for etching a glass substrate includes a vessel configured to contain an etchant; a first plate in the vessel and configured to receive a horizontally placed glass substrate thereon; and a circulating unit in the vessel facing the first plate and configured to create a flow of the etchant on a side of the first plate.

6 Claims, 6 Drawing Sheets

(56) References Cited

U.S. PATENT DOCUMENTS

| | | | | |
|---|---|---|---|---|
| 5,308,447 | A * | 5/1994 | Lewis | B24B 37/013 216/23 |
| 5,540,247 | A | 7/1996 | Kawatani et al. | |
| 5,846,444 | A * | 12/1998 | Edwards et al. | 216/90 |
| 6,028,669 | A * | 2/2000 | Tzeng | G01B 11/0683 356/504 |
| 6,077,452 | A * | 6/2000 | Litvak | B24B 37/013 216/85 |
| 6,103,096 | A * | 8/2000 | Datta | C25F 7/00 204/212 |
| 6,203,412 | B1 * | 3/2001 | Quek | B24B 37/042 451/285 |
| 6,228,211 | B1 | 5/2001 | Jeong | |
| 6,426,232 | B1 * | 7/2002 | Litvak | B24B 37/013 356/601 |
| 6,445,457 | B1 * | 9/2002 | Early | G01B 11/0666 356/630 |
| 6,454,916 | B1 * | 9/2002 | Wang | B23H 5/08 204/212 |
| 6,558,238 | B1 * | 5/2003 | Crevasse | B24B 57/02 451/287 |
| 6,875,322 | B1 * | 4/2005 | Kistler | B24B 37/20 204/224 M |
| 2002/0067459 | A1 * | 6/2002 | Sugano | C03C 15/00 349/187 |
| 2003/0090671 | A1 * | 5/2003 | Takahashi | G01B 11/06 356/479 |
| 2003/0218145 | A1 * | 11/2003 | Tanabe | G01N 21/552 250/559.45 |
| 2003/0221953 | A1 * | 12/2003 | Oberlitner | C25D 5/08 204/224 M |
| 2004/0035712 | A1 * | 2/2004 | Akram | C25F 7/00 205/133 |
| 2004/0055876 | A1 * | 3/2004 | Browne | C25D 21/10 204/261 |
| 2004/0080757 | A1 * | 4/2004 | Stanke | B24B 37/34 356/601 |
| 2004/0192063 | A1 * | 9/2004 | Koike | B24B 37/013 438/736 |
| 2004/0200788 | A1 * | 10/2004 | Shon | H01L 21/6734 211/41.18 |
| 2005/0023231 | A1 * | 2/2005 | Huang | H01L 21/67343 211/41.18 |
| 2005/0069402 | A1 * | 3/2005 | Yoshizawa | H01L 21/6734 414/286 |
| 2005/0196522 | A1 * | 9/2005 | Price | C25D 21/12 427/8 |
| 2007/0151844 | A1 * | 7/2007 | Wilson | C25D 5/18 204/230.2 |
| 2007/0194145 | A1 * | 8/2007 | Lee et al. | 239/124 |
| 2009/0065478 | A1 * | 3/2009 | Dockery | G01B 11/0675 216/60 |
| 2009/0139871 | A1 * | 6/2009 | Saito | C25D 21/10 205/148 |
| 2009/0294405 | A1 * | 12/2009 | Ogawa | H01L 21/67253 216/84 |
| 2010/0285723 | A1 * | 11/2010 | Lin | B24B 37/107 451/5 |

FOREIGN PATENT DOCUMENTS

| | | | |
|---|---|---|---|
| DE | 196 39 949 A1 | 4/1997 | |
| JP | 02-080339 A | 3/1990 | |
| JP | 02080339 A * | 3/1990 | C03B 37/014 |
| JP | 05-198555 | 8/1993 | |
| JP | 07-161678 | 6/1995 | |
| JP | 2000-128578 | 5/2000 | |
| KR | 0143751 | 4/1998 | |
| KR | 10-2000-0019079 | 4/2000 | |
| KR | 10-2002-0048128 | 6/2002 | |
| KR | 20020048128 A * | 6/2002 | |
| KR | 20020080215 A * | 10/2002 | |
| KR | 10-2002-0092087 A | 12/2002 | |
| KR | 20020092087 A * | 12/2002 | |
| KR | 10-2008-0088452 A | 10/2008 | |
| KR | 10-2009-0020821 A | 2/2009 | |
| KR | 20090020821 A * | 2/2009 | |
| KR | 10-2009-0052422 A | 5/2009 | |
| KR | 20090052422 A * | 5/2009 | |
| KR | 10-2009-0070792 A | 7/2009 | |
| KR | 20090070792 A * | 7/2009 | |

OTHER PUBLICATIONS

Office Action dated Apr. 24, 2012 (currently also made record) from the corresponding European application (EP 20110186844) of this US application.*

Office Action dated Jan. 13, 2015 (currently also made of record) from the corresponding Japanese application (JP 20110208705) of this US application.*

Office Action dated May 24, 2012 (currently also made of record) from the corresponding Korean application (KR 20100106208) of this US application.*

Taiwan examination report dated Jan. 16, 2014, for corresponding Taiwan Patent application 100139091 (7 pages).

Chinese Office action dated Jan. 21, 2014, for corresponding Chinese Patent application 201110333585.5 (12 pages).

European Search Report dated Apr. 24, 2012, for corresponding European Patent application 11186844.4, (5 pages).

* cited by examiner

APPARATUS OF ETCHING GLASS SUBSTRATE

CROSS-REFERENCE

This application claims priority to and the benefit of Korean Patent Application No. 10-2010-0106208, filed on Oct. 28, 2010 in the Korean Intellectual Property Office, the entire content of which is hereby incorporated by reference.

BACKGROUND

1. Field

The present disclosure herein relates to an etching apparatus.

2. Description of Related Art

Flat panel displays include glass substrates formed of silicon oxide. Since the glass substrate is the heaviest part of a flat panel display, much research is being conducted to develop lighter glass substrates for providing lighter and slimmer flat panel displays.

A representative method of reducing the weight of a glass substrate may be to reduce the thickness of the glass substrate. In order to do so, a substrate glass should be smooth after being etched. That is, uniformity of a glass substrate is important in reducing the thickness of the glass substrate because a flat panel display may have an image quality defect if a non-uniform glass substrate is used.

SUMMARY

An aspect of an embodiment of the present invention is directed toward an apparatus for etching a glass substrate uniformly and efficiently.

Embodiments of the present invention provide an apparatus for etching a glass substrate, the apparatus including a vessel configured to contain an etchant; a first plate in the vessel and configured to receive a horizontally placed glass substrate thereon; and a circulating unit in the vessel facing the first plate and configured to create a flow of the etchant on a side of the first plate.

The circulating unit may include a second plate facing the first plate; and a rotation blade on a top side or bottom side of the second plate.

The first and second plates may have a circular shape in a plan view.

The circulating unit may further include a driving unit configured to control the second plate. The driving unit may be configured to adjust a distance between the first and second plates and a rotation velocity of the second plate.

The apparatus for etching a glass substrate may further include a sensor on a sidewall of the vessel and adjacent to the first plate and configured to measure a thickness of the glass substrate; and a control unit configured to receive a signal from the sensor and provide a driving signal to the driving unit.

The apparatus for etching a glass substrate may further include a collecting pipe connected to a bottom side of the vessel to discharge the etchant. A material or particles etched from the glass substrate may be collected to the collecting pipe by the flow of the etchant.

The apparatus for etching a glass substrate may further include a valve configured to control the flow of the etchant in the collecting pipe; a filter configured to remove the material or particles from the etchant after the etchant passes through the valve; a supply pipe configured to supply the etchant into the vessel; and a pump configured to transfer the etchant to the supply pipe after the etchant passes through the filter.

The circulating unit may be configured to move horizontally with respect to the first plate to create the flow of the etchant.

The circulating unit may include a driving unit configured to control an operation of a body and a horizontally movable blade attached to the body. The driving unit may be configured to adjust a distance between the first plate and the body and a horizontal velocity of the body.

The first plate may have a rectangular shape in a plan view.

According to another embodiment of the present invention, an apparatus for etching a glass substrate includes a vessel configured to contain an etchant; and a plate in the vessel and configured to receive a horizontally placed glass substrate thereon. The plate may be configured to be rotated to induce a flow of the etchant.

The apparatus for etching a glass substrate may further include a driving unit configured to control the plate. The driving unit may be configured to control a vertical movement and a rotation velocity of the plate.

The apparatus for etching a glass substrate may further include a sensor on a sidewall of the vessel and adjacent to the plate and configured to measure a thickness of the glass substrate; and a control unit configured to receive a signal from the sensor and provide a driving signal to the driving unit.

According to another embodiment of the present invention, an apparatus for etching a glass substrate includes a vessel configured to contain an etchant; a first plate in the vessel and configured to receive a glass substrate thereon, the glass substrate having a main plane parallel to a side of the first plate; and a circulating unit in the vessel and configured to create a flow of the etchant on the side of the first plate.

BRIEF DESCRIPTION OF THE DRAWINGS

The accompanying drawings are included to provide a further understanding of embodiments of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
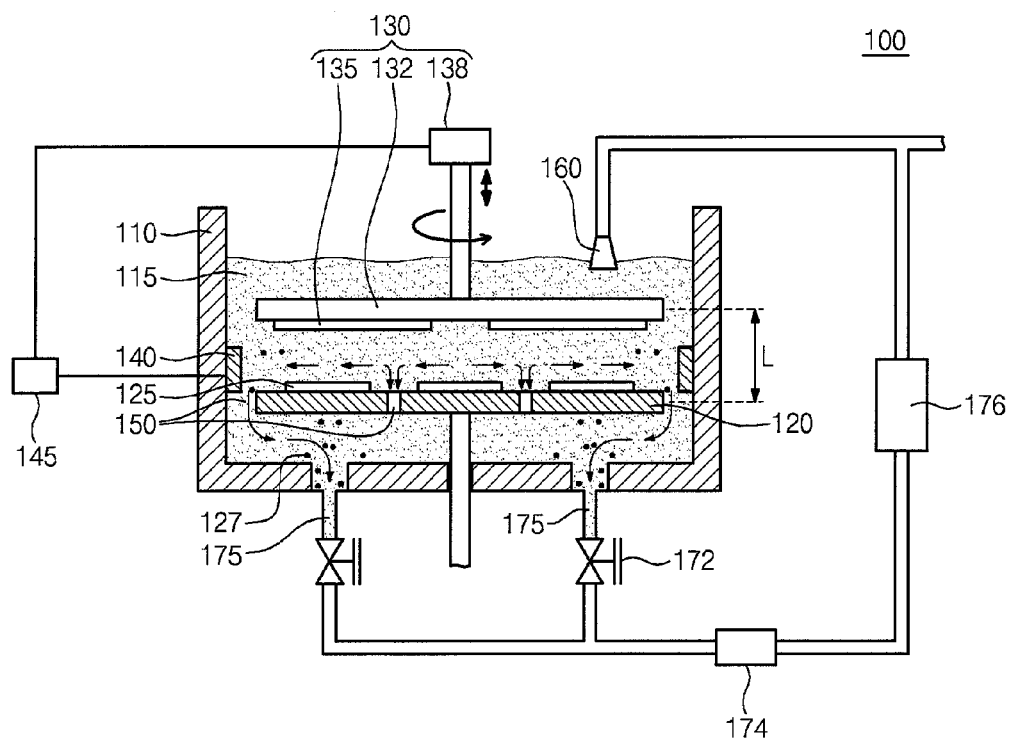
FIG. 1 is a view illustrating an apparatus for etching a glass substrate according to a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when one element is referred to as being 'on' another element, it can be directly on the other element, or one or more intervening elements may also be present therebetween. In the drawings, like reference numerals refer to like elements throughout.

In the specification, embodiments will be described with reference to exemplary sectional views and perspective views. Accordingly, shapes of the exemplary views may be modified according to manufacturing techniques and/or allowable errors.

It will be understood that although terms like first, second, and third are used herein to describe various elements, these elements should not be limited by these terms. These terms are used only to discriminate one element from another element. Embodiments described and exemplified herein include complementary embodiments thereof.

Terms used herein are for explaining embodiments while not limiting the present invention. Terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Figure 2:
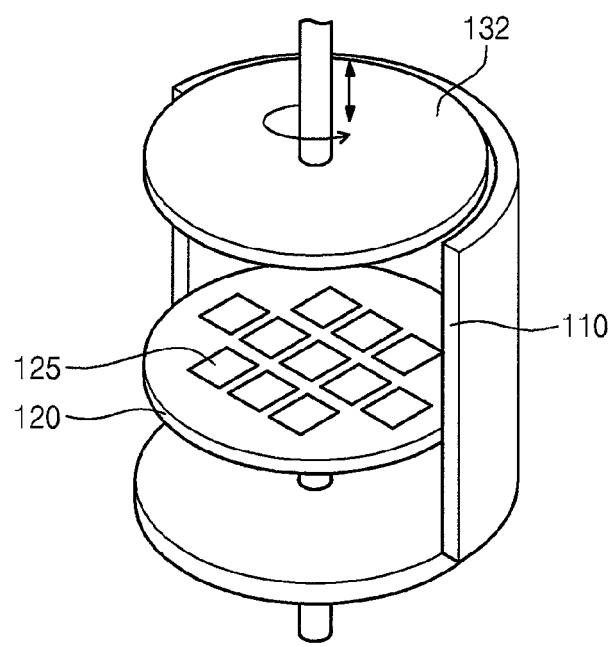
FIG. 2 is a detailed view illustrating a vessel and a plate of the glass substrate etching apparatus according to the first embodiment of the present invention.
Figure 3:
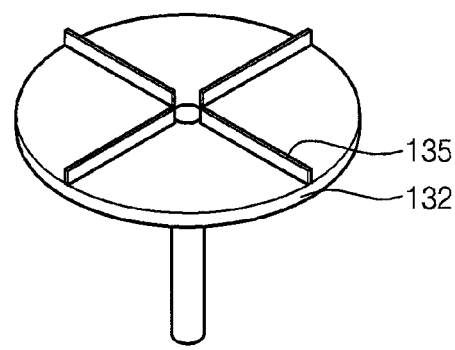
FIG. 3 is a detailed view illustrating the plate and rotation blades of the glass substrate etching apparatus according to the first embodiment of the present invention.

FIG. 1 is a view illustrating a glass substrate etching apparatus 100 for etching a glass substrate according to a first embodiment of the present invention. FIG. 2 is a detailed perspective view illustrating a vessel 110 and first and second plates 120 and 132 of the glass substrate etching apparatus 100 according to the first embodiment of the present invention. FIG. 3 is a detailed view illustrating the second plate 132 and rotation blades 135 according to the first embodiment of the present invention.

Referring to FIGS. 1 to 3, the glass substrate etching apparatus 100 includes: the vessel 110 configured to contain an etchant 115; the first plate 120 disposed in the vessel 110 to horizontally place a glass substrate 125 thereon (i.e., the glass substrate 125 has a main plane that is placed to face or oppose or be parallel to a topside of the first plate 120); and a circulating unit 130 disposed in the vessel 110 to circulate the etchant 115 on the topside of the first plate 120.

The glass substrate 125 may be placed on the first plate 120 by a vacuum adhesion method. A plurality of glass substrates 125 may be provided on the first plate 120 in the same way. In this case, since the plurality of glass substrates 125 are reduced in thickness at the same or concurrent time, manufacturing costs may be reduced. The etchant 115 may include fluoride salt, sulfate, nitrate, sulfonate, hydrofluoric acid, sulfuric acid, and/or nitric acid. The etchant 115 may be heated to increase the etching rate. The glass substrate 125 may be used for a display such as a touch screen panel.

The circulating unit 130 may include a second plate 132 facing the first plate 120, and rotation blades 135 disposed on the backside of the second plate 132 (e.g., the side facing the first plate 120). The first and second plates 120 and 132 may have a circular shape when viewed from the top. The vessel 110 may have a cylindrical shape.

The circulating unit 130 may further include a driving unit 138 to control the second plate 132. The driving unit 138 may move the second plate 132 vertically. A distance (L) between the first and second plates 120 and 132 may be adjusted by moving the second plate 132 vertically. The driving unit 138 may control the rotation velocity of the second plate 132. The rotation blades 135 may create a vortex flow so that the flow of the etchant 115 on the glass substrate 125 may be affected by the vortex flow.

The driving unit 138 may adjust the etching rate of the glass substrate 125 by controlling the vertical movement and rotation velocity of the second plate 132. The driving unit 138 may create a constant-velocity flow of the etchant 115 by using the rotation blades 135, to etch a side of the glass substrate 125.

The glass substrate etching apparatus 100 may further include a sensor 140 disposed on a sidewall of the vessel 110 at a position close to the first plate 120, to measure the thickness of the glass substrate 125. The sensor 140 may be a laser sensor. The sensor 140 may measure the thickness of the glass substrate 125 by providing a signal to the glass substrate and receiving (or measuring) the signal which is reflected by the glass substrate. The glass substrate etching apparatus 100 may further include a control unit 145 configured to receive a signal from the sensor 140 and transmit a driving signal to the driving unit 138. A thickness of the etched (or etched-away) glass substrate 125 may be measured by using the sensor 140, and the velocity of the driving unit 138 may be adjusted by using a driving signal of the control unit 145. The glass substrate 125 may be etched to a small thickness, for example, about 0.02 mm, by using the sensor 140, the driving unit 138, and the control unit 145. When the glass substrate 125 has a smaller thickness, it is possible to reduce thickness and weight of a display (for example, a touch screen panel, a liquid crystal display, or an organic electroluminescent device) using the glass substrate 125. The glass substrate 125 may be bent (or be flexible) owing to its small thickness. For example, the glass substrate 125 may be used for a flexible display.

The glass substrate etching apparatus 100 may further include a supply pipe 160 configured to supply an etchant 115 into the vessel 110, collecting pipes 175 connected to the bottom side of the vessel 110 to discharge the etchant 115 therethrough; and discharge holes 150 formed between the first plate 120 and the vessel 110. The discharge holes 150 may be formed through the first plate 120. An etchant 115 supplied through the supply pipe 160 may be circulated by the circulating unit 130 and flow to the collecting pipes 175 through the discharge holes 150. Due to this flow of the etchant 115, the glass substrate 125 may be etched. This may be called 'fluid flow grinding.'

The glass substrate etching apparatus 100 may further include valves 172 configured to control the flow of the etchant 115 in the collecting pipes 175, a filter 174 configured to purify the etchant 115 after the etchant 115 passes through the valves 172, and a pump 176 configured to transfer the etchant 115 purified by the filter 174 to the supply pipe 160. A material or particles 127 etched from the glass substrate 125 may be removed from the etchant 115 by the filter 174. The etchant 115 may be circulated through the collecting pipes 175, the filter 174, the pump 176, and the supply pipe 160. That is, the etchant 115 may be reused.

Figure 4:
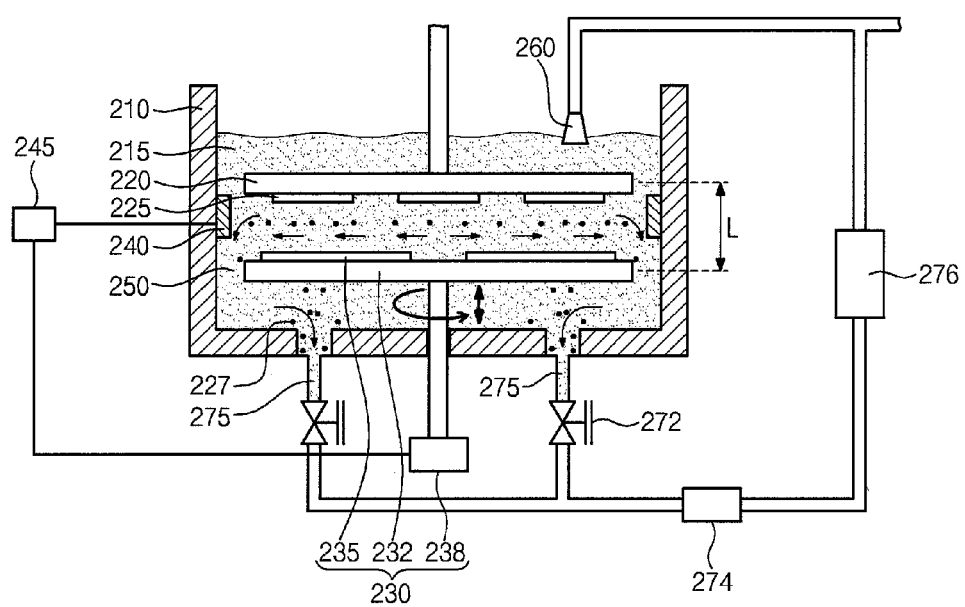
FIG. 4 is a view illustrating an apparatus for etching a glass substrate according to a second embodiment of the present invention.

FIG. 4 is a view illustrating a glass substrate etching apparatus 200 for etching a glass substrate according to a second embodiment of the present invention. The same description as that of the first embodiment of FIGS. 1 through 3 will not be repeated for brevity of the description.

Referring to FIG. 4, according to the second embodiment of the present invention, the glass substrate etching apparatus 200 includes: a vessel 210 configured to contain an etchant 215; a first plate 220 disposed in the vessel 210 to horizontally place glass substrates 225 thereon; and a circulating unit 230 disposed in the vessel 210 to circulate the etchant 215 on the bottom side of the first plate 220.

The glass substrates 225 may be placed on the first plate 220 by a vacuum adhesion method. The glass substrates 225 may be placed on the backside of the first plate 220 (e.g., the side facing the circulating unit 230) by the vacuum adhesion method. The glass substrates 225 may be used for displays such as touch screen panels.

The circulating unit 230 may include a second plate 232 facing the first plate 220, and rotation blades 235 disposed on the topside of the second plate 232 (e.g., the side facing the first plate 220). The first and second plates 220 and 232 may have a circular shape when viewed from the top. The vessel 210 may have a cylindrical shape.

The circulating unit 230 may further include a driving unit 238 to control the second plate 232. The driving unit 238 may move the second plate 232 vertically. A distance (L) between the first and second plates 220 and 232 may be adjusted by moving the second plate 232 vertically. The driving unit 238 may control the rotation velocity of the second plate 232.

The driving unit 238 may adjust the etching rate of the glass substrates 225 by controlling the vertical movement and rotation velocity of the second plate 232. Exposed sides of the glass substrates 225 to the etchant may be etched by the flow of the etchant 215.

The glass substrate etching apparatus 200 may further include a sensor 240 disposed on a sidewall of the vessel 210 at a position close to the first plate 220 to measure the thickness of the glass substrate 225. The sensor 240 may be a laser sensor. The sensor 240 may measure the thickness of the glass substrates 225 by providing a signal to the glass substrates 225 and receiving (or measuring) the reflected signal. The glass substrate etching apparatus 200 may further include a control unit 245 configured to receive a signal from the sensor 240 and transmit a driving signal to the driving unit 238. Thicknesses of the etched (or etched-away) glass substrates 225 may be measured by using the sensor 240, and the velocity of the driving unit 238 may be adjusted by using a driving signal of the control unit 245.

The glass substrate etching apparatus 200 may further include a supply pipe 260 configured to supply an etchant 215 into the vessel 210, collecting pipes 275 connected to the bottom side of the vessel 210 to discharge the etchant 215 therethrough; and discharge holes 250 formed between the second plate 232 and the vessel 210. The discharge holes 250 may be formed through the second plate 232.

The glass substrate etching apparatus 200 may further include valves 272 configured to control the flow of the etchant 215 in the collecting pipes 275, a filter 274 configured to purify the etchant 215 after the etchant 215 passes through the valves 272, and a pump 276 configured to transfer the etchant 215 purified by the filter 274 to the supply pipe 260. A material or particles 227 etched from the glass substrates 225 may be removed from the etchant 215 by the filter 274. The etchant 215 may be circulated through the collecting pipes 275, the filter 274, the pump 276, and the supply pipe 260. That is, the etchant 215 may be reused.

Figure 5:
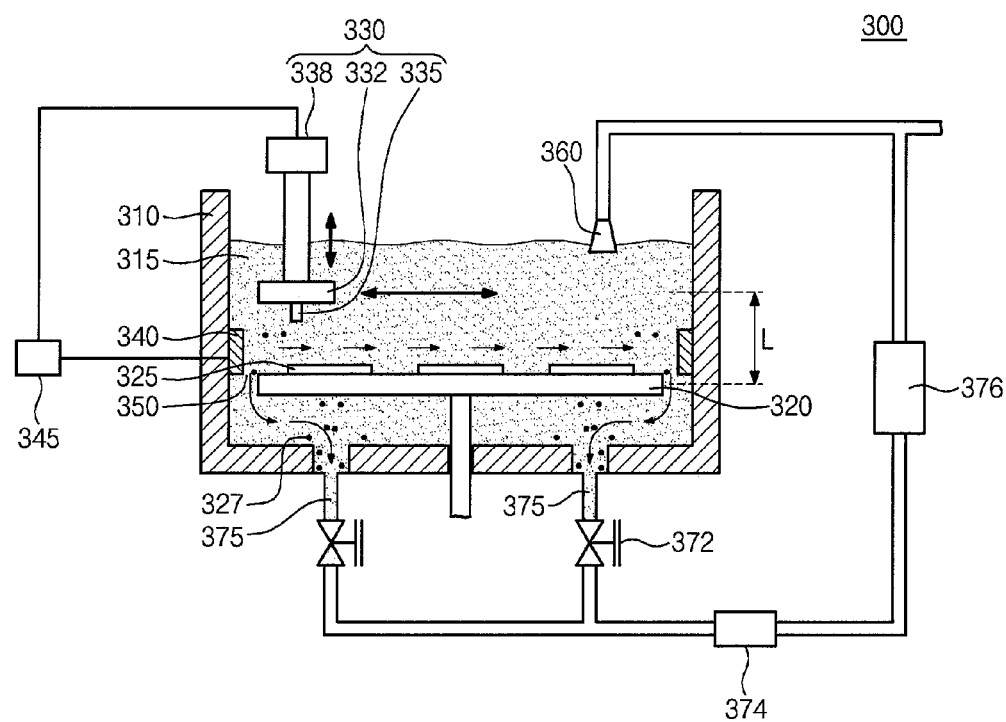
FIG. 5 is a view illustrating an apparatus for etching a glass substrate according to a third embodiment of the present invention.
Figure 6:
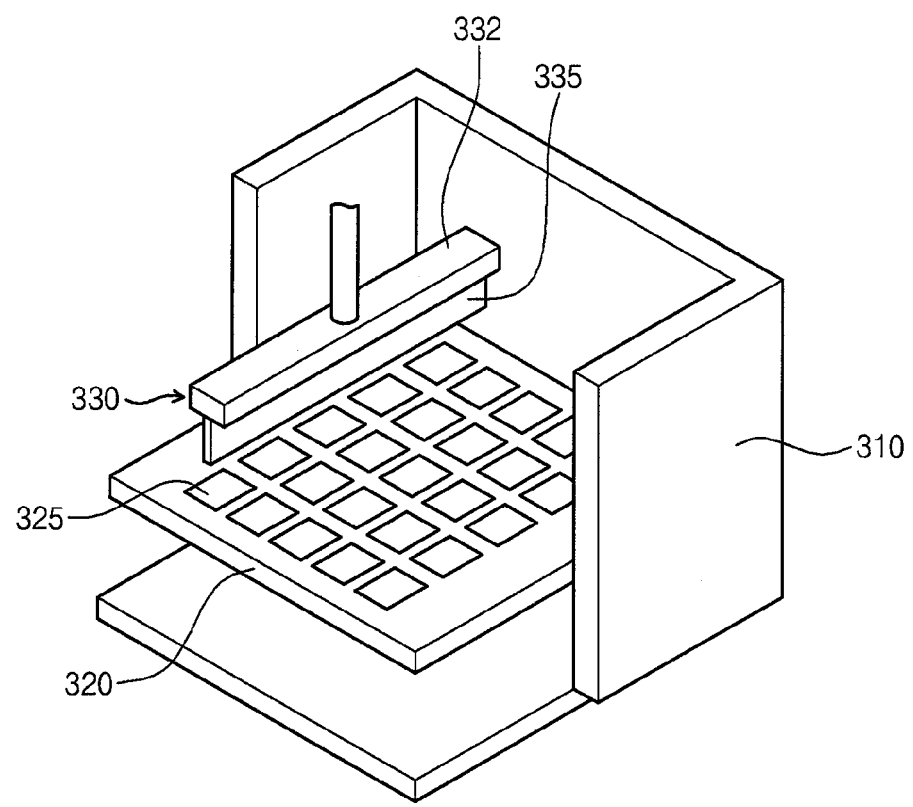
FIG. 6 is a detailed view illustrating a vessel, a plate, and a circulating unit of the glass substrate etching apparatus according to the third embodiment of the present invention.

FIG. 5 is a view illustrating a glass substrate etching apparatus 300 for etching a glass substrate according to a third embodiment of the present invention. FIG. 6 is a detailed view illustrating a vessel 310, a first plate 320, and a circulating unit 330 of the glass substrate etching apparatus 300 according to the third embodiment of the present invention. The same description as that of the first embodiment of FIGS. 1 through 3 will not be repeated for brevity of the description.

Referring to FIGS. 5 and 6, according to the third embodiment of the present invention, the glass substrate etching apparatus 300 includes: the vessel 310 configured to contain an etchant 315; a first plate 320 disposed in the vessel 310 to horizontally place glass substrates 325 thereon; and a circulating unit 330 disposed in the vessel 310 to circulate the etchant 315 on the topside of the first plate 320 (e.g., the side facing the circulating unit 330).

The glass substrates 325 may be placed on the first plate 320 by a vacuum adhesion method. The glass substrates 325 may be placed on the topside of the first plate 320 by the vacuum adhesion method. The glass substrates 325 may be used for displays such as touch screen panels.

The circulating unit 330 may include a body 332 disposed above the first plate 320, and a horizontally movable blade 335 disposed on the backside of the body 332 (e.g., the side facing the first plate 320). The first plate 320 may have a rectangular shape when viewed from the top.

The circulating unit 330 may further include a driving unit 338 to control movement of the body 332. The driving unit 338 may move the body 332 vertically. A distance (L) between the first plate 320 and the body 332 may be adjusted by moving the body 332 vertically. The driving unit 338 may further control the horizontal movement velocity of the body 332.

The driving unit 338 may adjust the etching rate of the glass substrates 325 by controlling vertical and horizontal movements of the body 332. Exposed sides of the glass substrates 325 may be etched by the flow of the etchant 315.

The glass substrate etching apparatus 300 may further include a sensor 340 disposed on a sidewall of the vessel 310 at a position close to the first plate 320 to measure the thickness of the glass substrates 325. The sensor 340 may be a laser sensor. The sensor 340 may measure the thickness of the glass substrates 325 by providing a signal to the glass substrates and receiving (or measuring) the signal which is reflected by the glass substrates. The glass substrate etching apparatus 300 may further include a control unit 345 configured to receive a signal from the sensor 340 and to transmit a driving signal to the driving unit 338. Thicknesses of the etched (or etched-away) glass substrates 325 may be measured by using the sensor 340, and the velocity of the driving unit 338 may be adjusted by using a driving signal of the control unit 345.

The glass substrate etching apparatus 300 may further include a supply pipe 360 configured to supply an etchant 315 into the vessel 310, collecting pipes 375 connected to the bottom side of the vessel 310 to discharge the etchant 315 therethrough; and discharge holes 350 formed between the first plate 320 and the vessel 310. The discharge holes 350 may be formed through the first plate 320.

The glass substrate etching apparatus 300 may further include valves 372 configured to control flows of the etchant 315 in the collecting pipes 375, a filter 374 configured to purify the etchant 315 after the etchant 315 passes through the valves 372, and a pump 376 configured to transfer the etchant 315 purified by the filter 374 to the supply pipe 360. A material or particles 327 etched from the glass substrates 325 may be removed from the etchant 315 by the filter 374. The etchant 315 may be circulated through the collecting pipes 375, the filter 374, the pump 376, and the supply pipe 360. That is, the etchant 315 may be reused.

According to the third embodiment of the present invention, the glass substrate etching apparatus 300 can etch the glass substrates 325 to a small thickness. In addition, since the glass substrate etching apparatus 300 includes the circulating unit 330 which is vertically movable, the glass substrates 325 can be uniformly etched to the same thickness.

Figure 7:
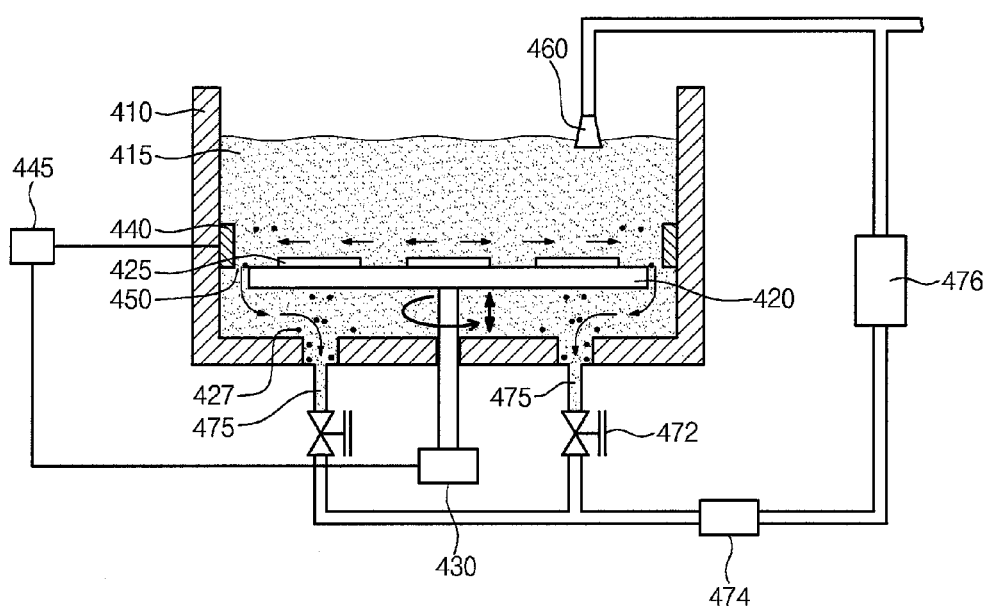
FIG. 7 is a view illustrating an apparatus for etching a glass substrate according to a fourth embodiment of the present invention.

FIG. 7 is a view illustrating a glass substrate etching apparatus 400 for etching a glass substrate according to a fourth embodiment of the present invention.

Referring to FIG. 7, according to the fourth embodiment of the present invention, the glass substrate etching apparatus 400 includes: a vessel 410 configured to contain an etchant 415; and a plate 420 disposed in the vessel 410 to horizontally place glass substrates 425 thereon. The plate 420 may be rotated to create a flow (e.g., a relative flow) of the etchant 415.

The glass substrates 425 may be placed on the plate 420 by a vacuum adhesion method. The glass substrates 425 may be placed on the topside of the plate 420 by the vacuum adhesion method. The glass substrates 425 may be used for touch screen panels.

The glass substrate etching apparatus 400 may further include a driving unit 430 configured to control the plate 420. The driving unit 430 may control the rotation velocity of the plate 420. The driving unit 430 may move the plate 420 vertically.

The driving unit 430 may adjust the etching rate of the glass substrates 425 by controlling vertical movement and rotation of the plate 420. Exposed sides of the glass substrates 425 may be etched by a flow (e.g., a relative flow) of the etchant 415.

The glass substrate etching apparatus 400 may further include a sensor 440 disposed on a sidewall of the vessel 410 at a position close to the plate 420 to measure the thickness of the glass substrates 425. The sensor 440 may be a laser sensor. The glass substrate etching apparatus 400 may further include a control unit 445 configured to receive a signal from the sensor 440 and transmit a driving signal to the driving unit 430. Thicknesses of the etched (or etched-away) glass substrates 425 may be measured by using the sensor 440, and the velocity of the driving unit 430 may be adjusted by using a driving signal of the control unit 445.

The glass substrate etching apparatus 400 may further include a supply pipe 460 configured to supply an etchant 415 into the vessel 410, collecting pipes 475 connected to the bottom side of the vessel 410 to discharge the etchant 415 therethrough; and discharge holes 450 formed between the plate 420 and the vessel 410. The discharge holes 450 may be formed through the plate 420.

The glass substrate etching apparatus 400 may further include valves 472 configured to control flows of the etchant 415 in the collecting pipes 475, a filter 474 configured to purify the etchant 415 after the etchant 415 passes through the valves 472, and a pump 476 configured to transfer the etchant 415 purified by the filter 474 to the supply pipe 460. A material or particles 427 etched from the glass substrates 425 may be removed from the etchant 415 by the filter 474. The etchant 415 may be circulated through the collecting pipes 475, the filter 474, the pump 476, and the supply pipe 460. That is, the etchant 415 may be reused.

Table 1 below shows glass substrate thicknesses obtained according to an embodiment of the present invention in comparison with glass substrate thicknesses obtained according to a comparative example. In Table 1 below, S1 denotes a comparative example in which substrates are etched by immersing the substrates in an etchant, and S2 denotes an embodiment of the present invention in which substrates are etched by using a glass substrate etching apparatus according to an embodiment of the present invention.

As shown in Table 1 below, according to the embodiment of the present invention, the thicknesses of the substrates can be reduced to about 1/10 the thicknesses of the substrates of the comparative example. In addition, substrates fabricated according to an embodiment of the present invention have good flexibility and can have a radius of curvature of about 10 cm.

TABLE 1

|  | S1 | S2 |
|---|---|---|
| 1 | 0.213 mm | 0.019 mm |
| 2 | 0.201 mm | 0.020 mm |
| 3 | 0.199 mm | 0.021 mm |
| 4 | 0.208 mm | 0.018 mm |
| 5 | 0.219 mm | 0.022 mm |
| 6 | 0.188 mm | 0.021 mm |
| Average | 0.205 mm | 0.020 mm |

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for etching a glass substrate, the apparatus comprising:
    a vessel configured to contain an etchant;
    a first plate in the vessel and configured to receive a horizontally placed glass substrate thereon;
    a circulating unit in the vessel facing the first plate, the circulating unit comprising
        a body configured to create a flow of the etchant on a side of the first plate, and
        a driving unit attached to the body and configured to control an operation of the body;
    a sensor on a sidewall of the vessel and adjacent to the first plate and configured to measure a thickness of the glass substrate and generate a signal corresponding to the measured thickness; and
    a control unit configured to receive the signal corresponding to the measured thickness from the sensor and provide a driving signal to the driving unit,
    wherein the driving unit is configured to be moved horizontally with respect to the first plate, from one end of the vessel to an opposite end of the vessel, and configured to be vertically moved and horizontally moved with respect to the first plate in response to the driving signal, to adjust an etching rate of the glass substrate.

2. The apparatus of claim 1, further comprising a collecting pipe connected to a bottom side of the vessel to discharge the etchant,
   wherein a material or particles etched from the glass substrate are collected to the collecting pipe by the flow of the etchant.

3. The apparatus of claim 2, further comprising:
   a valve configured to control the flow of the etchant in the collecting pipe;
   a filter configured to remove the material or particles from the etchant after the etchant passes through the valve;
   a supply pipe configured to supply the etchant into the vessel; and
   a pump configured to transfer the etchant to the supply pipe after the etchant passes through the filter.

4. The apparatus of claim 1, wherein the circulating unit further comprises:
   a horizontally movable blade attached to the body,
   wherein the driving unit is configured to adjust a distance between the first plate and the body and a horizontal velocity of the body in response to the driving signal.

5. The apparatus of claim 4, wherein the first plate has a rectangular shape in a plan view.

6. The apparatus of claim 1, wherein the first plate comprises discharge holes formed through the first plate.

* * * * *